United States Patent [19]

Wakabayashi et al.

[11] Patent Number: 5,376,225
[45] Date of Patent: Dec. 27, 1994

[54] METHOD OF FORMING FINE STRUCTURE ON COMPOUND SEMICONDUCTOR WITH INCLINED ION BEAM ETCHING

[75] Inventors: Shinichi Wakabayashi; Hitomaro Tougou, both of Kawasaki; Yukio Toyoda, Suginami, all of Japan

[73] Assignee: Matsushita Electric Industrial Co., Ltd., Japan

[21] Appl. No.: 2,973

[22] Filed: Jan. 11, 1993

[30] Foreign Application Priority Data

Aug. 26, 1992 [JP] Japan .................. 4-226882

[51] Int. Cl.$^5$ .................................. H01L 21/00
[52] U.S. Cl. .................... 156/643; 156/646; 156/661.1; 156/662; 156/659.1; 204/192.34; 204/192.35; 437/228; 437/225
[58] Field of Search ............. 156/643, 655, 662, 659.1, 156/661.1; 204/298.36, 192.34; 437/129, 133, 228, 225

[56] References Cited

U.S. PATENT DOCUMENTS

| | | | |
|---|---|---|---|
| 4,131,506 | 12/1978 | Namba et al. | 156/643 |
| 4,647,339 | 3/1987 | Houghton | 156/643 |
| 4,851,368 | 7/1989 | Behfar-Rad et al. | 437/129 |
| 4,865,684 | 9/1989 | Bouadma | 156/643 |
| 4,983,540 | 1/1991 | Yamaguchi et al. | 437/133 X |
| 5,035,770 | 7/1991 | Braun | 204/192.34 X |

OTHER PUBLICATIONS

Gokan et al, "Pattern Profile Control Utilizing Shadowing Effect in Oblique Ion-beam Etching", J. Vac. Sci Technol., 19(1), May/Jun., 1981.

"GaAs and GaAlAs Equi-Rate Etching Using a New Reactive Ion Beam Etching System" by Kiyoshi Asakawa et al; Japanese Journal of Applied Physics, vol. 22, No. 10; Oct., 1983; pp. L653–L655.

"Reactive Ion-Beam Etching of InP with Cl$_2$" by Katsuhiko Mutoh et al; Japanese Journal of Applied Physics, vol. 29, No. 6; Jun., 1990: pp. 1022–1026.

"Simultaneous Fabrication of Vertical and 45° Mirrors of InP for Surface-Emitting Lasers Using Inclined CL Ion Beams" by Katsuhiko Mutoh et al; Japanese Journal of Applied Physics, vol. 30, No. 1; Jan., 1991; pp. 67–71.

*Primary Examiner*—Thi Dang
*Attorney, Agent, or Firm*—Parkhurst, Wendel & Rossi

[57] ABSTRACT

A first method of forming a fine structure on a compound semiconductor for providing vertical side wall surfaces of a wire is as follows:

One side wall surface of a wire is formed by applying an ion beam for etching with a predetermined incident angle on the side of this side wall surface to a surface of a compound semiconductor layer having a multiquantum well structure, covered with a first mask to from this side wall surface; and then, the other side wall surface is formed by applying the ion beam with the predetermined incident angle from the side of the other side wall surface to be formed after removal of the first mask and forming a second mask for forming the other side wall surface. In a second method, a third mask having a stripe pattern is formed on the surface of the compound semiconductor; one side of the wire is formed by first etching with the slantwise incident ion beam. The second etching is also formed similarly by the ion beam with the one side wall surface is protected. In the third method, a substantially circle mask is formed; and etched with the slantwise incident ion beam with the work being rotated.

17 Claims, 6 Drawing Sheets

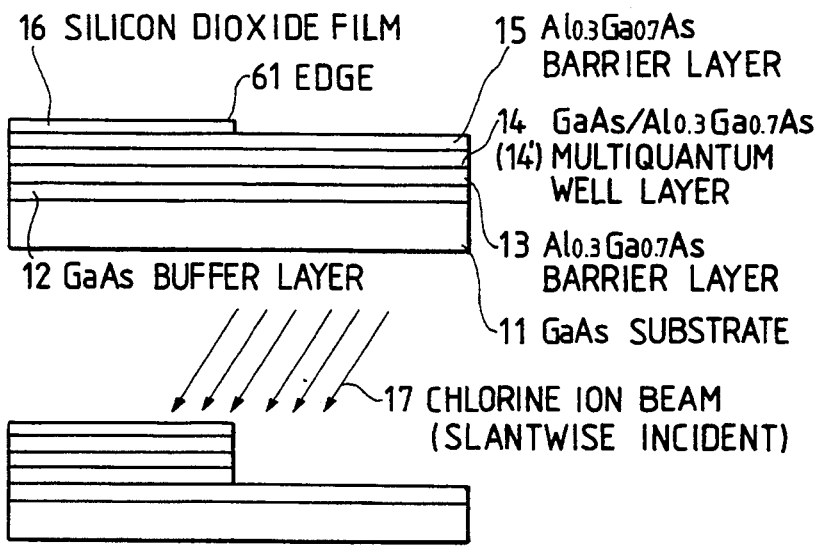
FIG. 1A
FIG. 1B
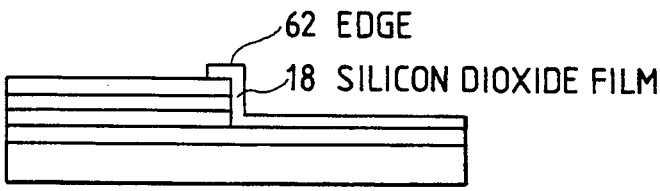
FIG. 1C
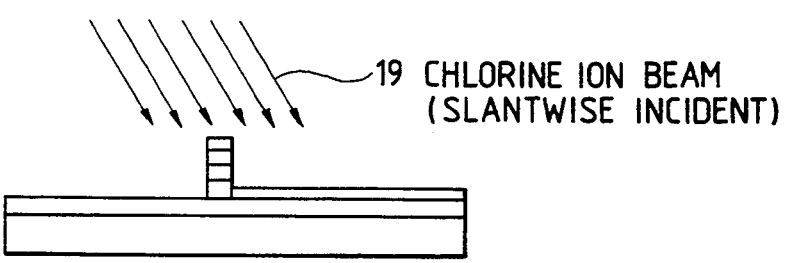
FIG. 1D
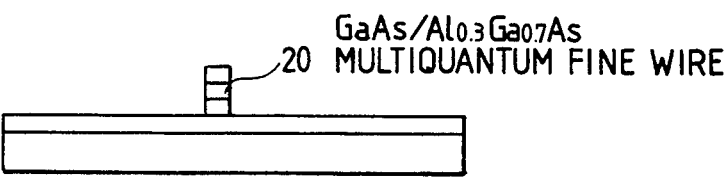
FIG. 1E

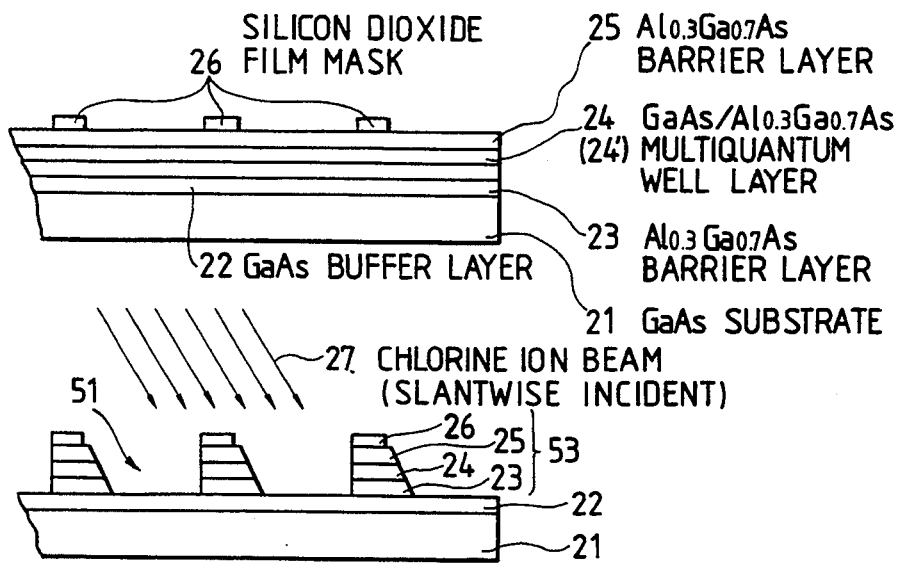
FIG. 2A
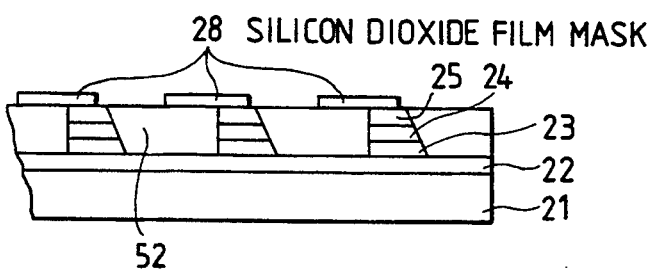
FIG. 2B
FIG. 2C
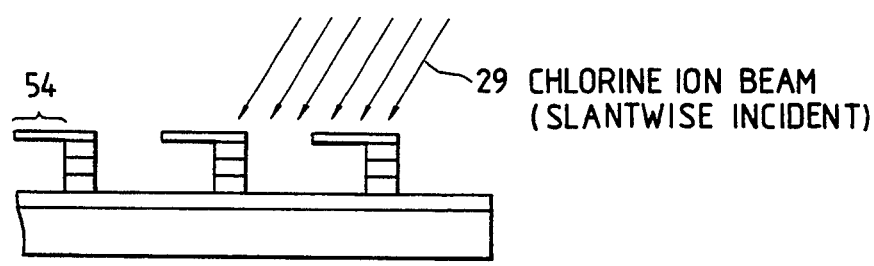
FIG. 2D
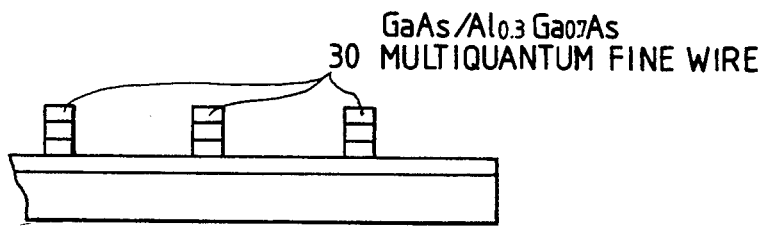
FIG. 2E FIG. 3A
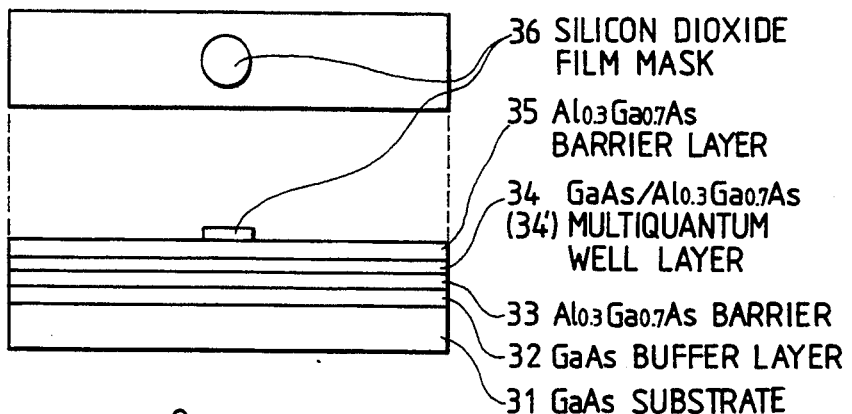
- 36 SILICON DIOXIDE FILM MASK
- 35 Al$_{0.3}$Ga$_{0.7}$As BARRIER LAYER
- 34 GaAs/Al$_{0.3}$Ga$_{0.7}$As (34) MULTIQUANTUM WELL LAYER
- 33 Al$_{0.3}$Ga$_{0.7}$As BARRIER
- 32 GaAs BUFFER LAYER
- 31 GaAs SUBSTRATE
FIG. 3B
FIG. 3C
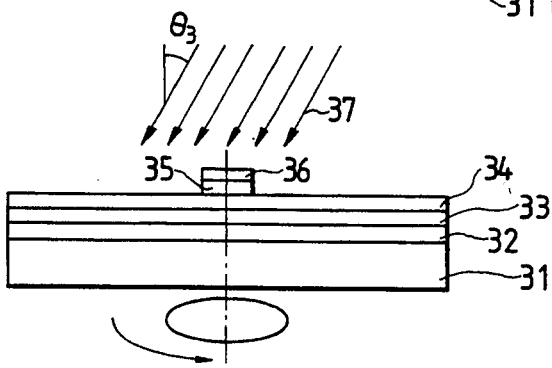
FIG. 3D
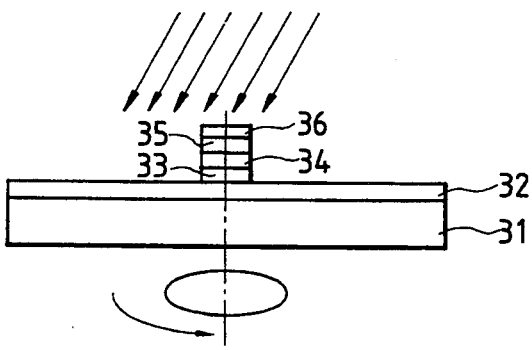
FIG. 3E
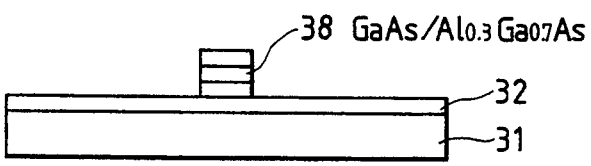
38 GaAs/Al$_{0.3}$Ga$_{0.7}$As

METHOD OF FORMING FINE STRUCTURE ON COMPOUND SEMICONDUCTOR WITH INCLINED ION BEAM ETCHING

BACKGROUND OF THE INVENTION

1. Field of the Invention

This invention relates to a method of forming a fine structure on a compound semiconductor and particularly relates to a method of forming a fine structure on a compound semiconductor with inclined ion beam etching.

2. Description of the Prior Art

Methods of forming a quantum fine structure by etching a semiconductor layer having a quantum well structure with an etching mask having a fine pattern is known. Dry etching is one of efficient methods for such methods because it provides a high controllability and a high aspect ratio.

In the optical devices, electronic devices, and optoelectronic integration circuits used in optical information processings, optical communication systems, or optical measurements, characteristics of devices can be improved by applying a fine-processed structure, such as a quantum wire or quantum box structures to an active layer of a semiconductor laser to obtain compactification and high functions of the device. The dry etching has a high controllability and can provide a high aspect ratio in the processing of forming a wire including a quantum well structure with an etching mask having a fine patten.

FIGS. 4A to 4D are cross-sectional views of a semiconductor material to be processed through a prior art processing method for illustrating processing of a prior art for forming GaAs quantum wires. The quantum wires 49 as fine structures are obtained as follows:

A silicon dioxide film 46 is formed as an etching mask by deposition of silicon dioxide on a wafer comprising: a GaAs buffer layer 42, $Al_{0.3}Ga_{0.7}As$ barrier layer 43, $GaAs/Al_{0.3}Ga_{0.7}As$ multiquantum well layer 44, and an $Al_{0.3}Ga_{0.7}As$ barrier layer 45 are consecutively grown by crystal growth on a GaAs substrate 41. A resist pattern 47 is formed by the electron beam lithography or the like as shown in FIG. 4A.

The silicon dioxide film 46 is etched by an etchant including a hydrofluoric acid in order to transfer the pattern of the resist 47 thereon as shown in FIG. 4B.

The $Al_{0.3}Ga_{0.7}As$ barrier layer 43 and the $GaAs/Al_{0.3}Ga_{0.7}As$ multiquantum well layer 44 are consecutively etched by a chlorine plasma atmosphere 48 using the silicon dioxide film 46 as an etching mask as shown in FIG. 4C.

The etching is continued and then, $GaAs/Al_{0.3}Ga_{0.7}As$ multiquantum wires 49 are formed. At last, the etching mask of the silicon dioxide film 46 is removed as shown in FIG. 4D.

However, it is difficult to make side wall surfaces of the $GaAs/Al_{0.3}Ga_{0.7}As$ multiquantum wire 48 vertical by the processing using the dry etching mentioned above. Therefore, the $GaAs/Al_{0.3}Ga_{0.7}As$ multiquantum wire 48 is formed to have a cross section with a trapezoid shape. Thus, there is a problem that a multiquantum wire with uniform width cannot be obtained. Uniformity of width of each of quantum wires directly affects characteristics of the device having the quantum wires. That is, it is difficult to obtain etching with a high density of wires per unit area and a high uniformity in width or space width of the wires per unit area though the dry etching providing a high aspect ratio is used.

SUMMARY OF THE INVENTION

The present invention has been developed in order to remove the above-described drawbacks inherent to the conventional method of forming a fine structure on a compound semiconductor.

According to the present invention there is provided a method of forming a wire on a compound semiconductor having a quantum well structure, which comprises the steps of: forming a first etching mask for providing one side wall surface of the wire; etching the compound semiconductor with a directional ion beam having a predetermined incident angle inclined to the side of the one side wall surface with respect to the wire; forming a second etching mask for providing the other side wall surface of the wire; and etching the compound semiconductor with the directional ion beam having the predetermined incident angle inclined to the side of the other side wall surface with respect to the wire.

According to the present invention there is also provided a method of forming a fine structure on a compound semiconductor having a quantum well structure, which comprises the steps of: forming an etching mask having a substantial circle; etching the compound semiconductor with a directional ion beam having a predetermined incident angle; and rotating the compound semiconductor during step of the etching around a normal thereof.

According to the present invention there is provided a method of forming a fine structure on a compound semiconductor, which comprises the steps of: covering a first portion of a surface of a compound semiconductor layer having a quantum well structure formed on a substrate with a first etching mask such that an edge of the first etching mask agrees with a first line on a surface of the compound semiconductor; etching the compound semiconductor and the first etching mask by applying an ion beam having directionality to the first etching mask and the compound semiconductor with in one direction having a predetermined elevation angle from a second line perpendicular to the first line; removing the first etching mask; covering a stripe portion of the portion extending from the first line by a predetermined width and side wall surface provided by the first mentioned etching with with a second etching mask; and etching the compound semiconductor and the second etching mask by applying the ion beam in the other direction having the predetermined elevation angle from the second line.

According to the present invention there is also provided a method of forming a fine structure on a compound semiconductor, which comprises the steps of: forming a first etching mask having a first stripe having a first predetermined width along a first line on a surface of a compound semiconductor layer having a quantum well structure formed on a substrate; etching the compound semiconductor and the first etching mask by applying an ion beam having directionality to the first etching mask and the compound semiconductor with in one direction having a predetermined elevation angle from a second line perpendicular to the first line; removing the first etching mask; filling etched portions with resist; forming a second etching mask having a second stripe having a second predetermined width larger than the first predetermined width, extending from the first line; removing the resist; and etching the compound semiconductor and the second etching mask by applying the ion beam in the other direction having the predetermined elevation angle from the second line.

According to the present invention there is further provided a method of forming a fine structure on a compound semiconductor, which comprises the steps of: forming an etching mask having a substantial circle on a surface of a compound semiconductor layer having a quantum well structure formed on a substrate; etching the compound semiconductor and the circle etching mask by applying an ion beam having a predetermined incident angle; and rotating the compound semiconductor, and the substrate, and the circle etching mask around a normal thereof during the etching.

BRIEF DESCRIPTION OF THE DRAWINGS

The object and features of the present invention will become more readily apparent from the following detailed description taken in conjunction with the accompanying drawings in which:

FIGS. 1A to 1E are cross-sectional views of a semiconductor material to be processed through processing method of a first embodiment for illustrating processing of forming a GaAs quantum wire;

FIGS. 2A to 2E are cross-sectional views of semiconductor materials to be processed through a processing method of a second embodiment for illustrating processing of forming a GaAs quantum wire;

FIG. 3A is a plan view of semiconductor materials to be processed through a processing method of a third embodiment for illustrating processing of forming a GaAs quantum box structure;

FIGS. 3B to 3E are cross-sectional views of semiconductor materials to be processed through a processing method of the third embodiment.

The same or corresponding elements or parts are designated as like references throughout the drawings.

DETAILED DESCRIPTION OF THE INVENTION

Hereinbelow will be described a first embodiment of this invention.

FIGS. 1A to 1E are cross-sectional views of a semiconductor material to be processed through processing method of this embodiment for illustrating processing of forming a GaAs quantum wire. Numeral 11 is a GaAs substrate on which a quantum wire structure is to be formed. Numeral 12 is a GaAs buffer layer. Numeral 13 is an $Al_{0.3}Ga_{0.7}As$ barrier layer. Numeral 14 is a GaAs-/$Al_{0.3}Ga_{0.7}As$ multiquantum well layer. Numeral 15 is an $Al_{0.3}Ga_{0.7}As$ barrier layer. Numeral 16 is a silicon dioxide film used as an etching mask formed on a portion of a surface of the $Al_{0.3}Ga_{0.7}As$ barrier layer 15. Numeral 17 is a slantwise incident chlorine ion beam having a predetermined incident angle $\theta_1$. Numeral 18 is a silicon dioxide film used for a second etching processing. Numeral 19 is a slantwise incident chlorine ion beam inclining by the predetermined angle $\theta_1$ in the opposite direction to the inclining direction of the chlorine ion beam 17. Numeral 20 is a GaAs/$Al_{0.3}Ga_{0.7}As$ multiquantum wire to be formed. In this embodiment, the GaAs/$Al_{0.3}Ga_{0.7}As$ multiquantum well layer 14 is used. However, a single quantum well layer 14' can be used also.

Figure 4A:
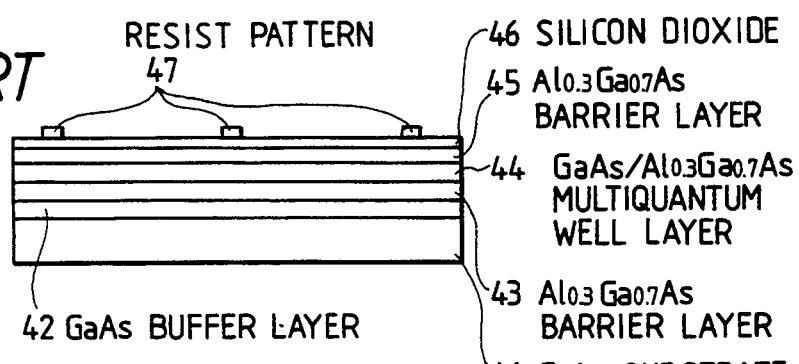
FIGS. 4A to 4D are cross-sectional views of a semiconductor material to be processed through a prior art processing method for illustrating processing of a prior art for forming GaAs quantum wires.
Figure 4B:
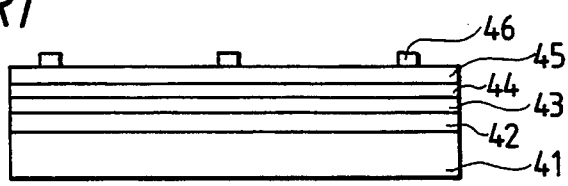
Figure 4C:
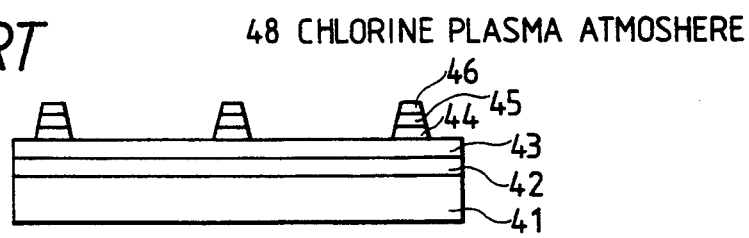
Figure 4D:
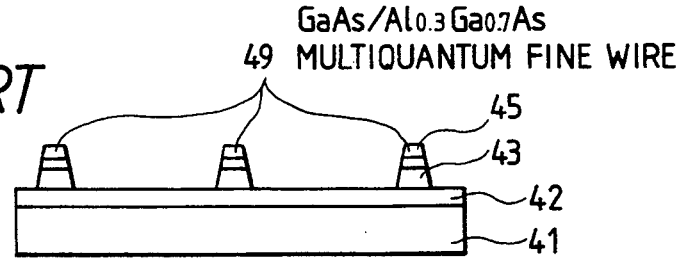
Figure 5:
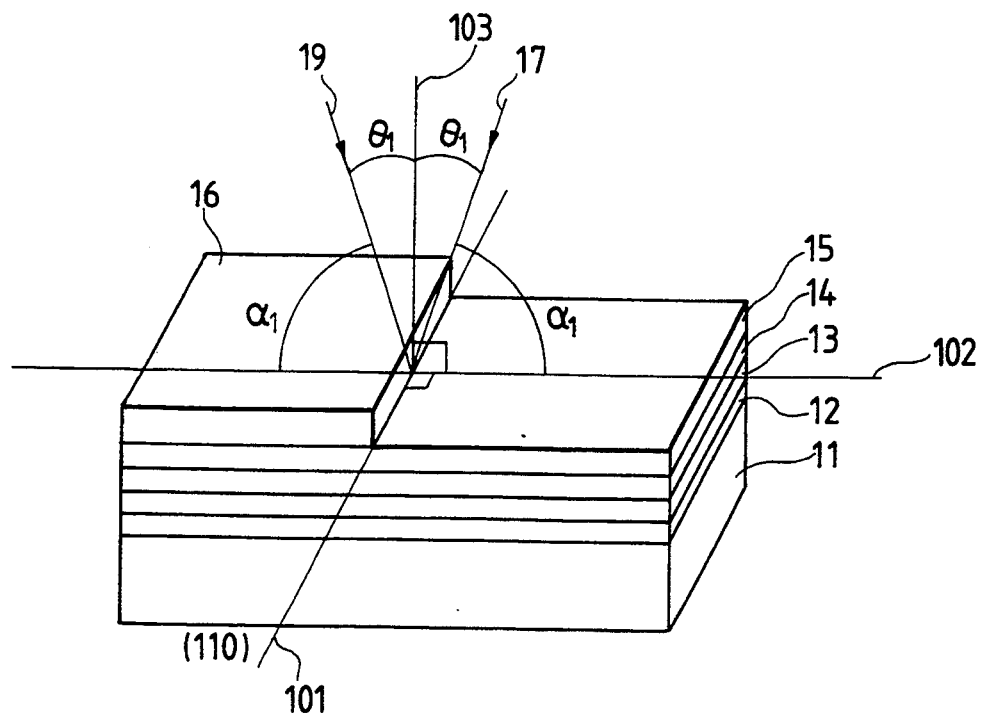
FIG. 5 is a perspective view of the first embodiment in the condition shown in FIG. 1A.

Hereinbelow will be described the processing of the structure mentioned above. FIG. 5 is a perspective view of the first embodiment in the condition shown in FIG. 1A showing tile incident angles $\theta_1$ of the chlorine ion beams 17 and their elevation angles $\alpha_1$.

The GaAs buffer layer 12, the $Al_{0.3}Ga_{0.7}As$ barrier layer 13, the GaAs/$Al_{0.3}Ga_{0.7}As$ multiquantum well layer 14, and the $Al_{0.3}Ga_{0.7}As$ barrier layer 15 are consecutively grown by crystal growth on a GaAs substrate 11. A silicon dioxide film 16 is formed by deposition on the $Al_{0.3}Ga_{0.7}As$ barrier layer 15 as shown in FIG. 1A. The silicon dioxide film 16 is formed to have a stripe pattern. The stripe pattern is formed such as to be arranged in the crystal orientation (110), that is a line 101.

. The $Al_{0.3}Ga_{0.7}As$ barrier layer 15, the GaAs/$Al_{0.3}Ga_{0.7}As$ multiquantum well layer 14, and the $Al_{0.3}Ga_{0.7}As$ barrier layer 13 are consecutively etched by the reactive ion etching with chlorine using the silicon dioxide film 16 as an etching mask. An incident direction of the chlorine ion beam 17 is inclined about thirty degrees in the plane perpendicular to the line 101. In other words, the an elevation angle of 60° from the line 102 perpendicular to the line 101. The silicon dioxide film 16 sufficiently functions as an etching mask because there is a difference between the silicon dioxide film 16 (18) and the mass of the compound semiconductor crystals ($Al_{0.3}Ga_{0.7}As$ barrier layer 13, GaAs/$Al_{0.3}Ga_{0.7}As$ multiquantum well layer 14, and $Al_{0.3}Ga_{0.7}As$ barrier layer 15) in the etching speed. Moreover, an edge 61 (62) of the etching mask of the silicon dioxide film 16 (18) is slightly etched, so that the edge of the silicon dioxide film 16 backs away slightly. Therefore, the surface of the mass of the compound semiconductor crystals under this edge is also etched. This makes the side wall formed by the etching further vertical as shown in FIG. 1B.

The reason why the ion beam 17 is incident slantwise is as follows:

If the ion beam is incident vertically toward the GaAs substrate 11, the etched side wall surface will be not vertical. This is described in Japanese Journal of Applied Physics vol 30, No 1, January 1991, pp 67 to 71. It describes that application of an ion beam with inclination of forty degrees provides substantially vertical side wall surfaces. That is, in the etching of compound semiconductors, it is better that the ion beam for etching is incident slantwise to obtain vertical etched side wall surfaces.

Then, the silicon dioxide film 18 is formed such that a portion where the multiquantum wire 20 is to be formed and the etched portion are covered after removal of the silicon dioxide film 16 as shown in FIG. 1C.

The chlorine ion beam 19 is applied to the work shown in FIG. 1C with an incident direction inclined by $\theta_1$=about thirty degrees in the opposite to the inclined direction of the chlorine ion beam 17 as shown in FIG. 1D.

Then, the silicon dioxide film 18 is removed. Then, the GaAs/Al$_{0.3}$Ga$_{0.7}$As multiquantum wire 20 having vertical side walls is provided as shown in FIG. 1E.

The slantwise incident reactive ion beams 17 and 19 are used for etching provides accurate etched side wall surfaces of the GaAs/Al$_{0.3}$Ga$_{0.7}$As multiquantum wire 20. Therefore, the processing of this embodiment provides fine structures, such as a quantum wire having a uniform width in the longitude direction using the multiquantum well with controllability.

In the first embodiment mentioned above, the compound semiconductors of the GaAs/Al$_{0.3}$Ga$_{0.7}$As system is used. However, this processing is applicable to other compound semiconductors, such as a compound semiconductor including InP or the like. Moreover, it is possible to form fine structures, such as a quantum box structure by forming the mask pattern to have a grid.

Hereinbelow will be described a second embodiment of this invention.

FIGS. 2A to 2E are cross-sectional views of semiconductor materials to be processed through a processing method of this embodiment for illustrating processing of forming a GaAs quantum wire. Numeral 21 is a GaAs substrate on which a quantum wire structure is to be formed. Numeral 22 is a GaAs buffer layer. Numeral 23 is an Al$_{0.3}$Ga$_{0.7}$As barrier layer. Numeral 24 is a GaAs/Al$_{0.3}$Ga$_{0.7}$As multiquantum well layer. Numeral 25 is an Al$_{0.3}$Ga$_{0.7}$As barrier layer. Numerals 26 are silicon dioxide films used as etching masks formed to have stripe pattern on the Al$_{0.7}$Ga$_{0.7}$As barrier layer 25. Numeral 27 is a slantwise incident chlorine ion beam. Numerals 28 are silicon dioxide films used for a second etching processing. Numeral 29 is a slantwise incident chlorine ion beam inclining in the opposite direction to the inclining direction of the chlorine ion beam 27. Numerals 30 are GaAs/Al$_{0.3}$Ga$_{0.7}$As multiquantum wires to be formed. In this embodiment, the GaAs/Al$_{0.3}$Ga$_{0.7}$As multiquantum well layer 24 is used. However,, a single quantum well layer 24' can be used also.

Figure 6:
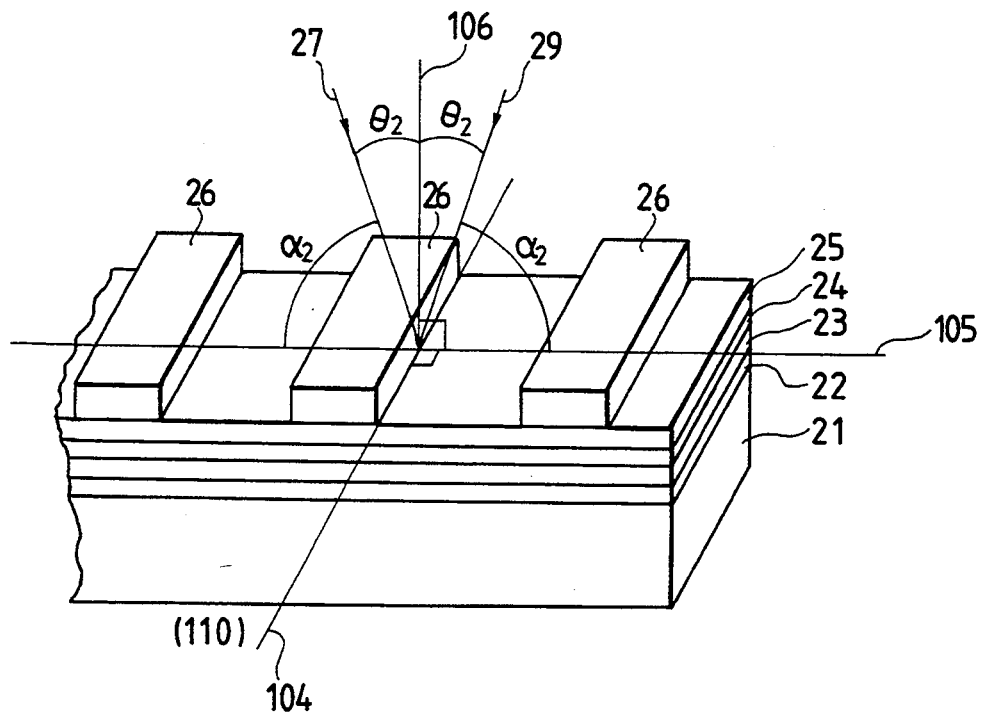
FIG. 6 is a perspective view of the second embodiment in the condition shown in FIG. 2A.

Hereinbelow will be described the processing of the second embodiment. FIG. 6 is a perspective view of the second embodiment in the condition shown in FIG. 2A showing the incident angles $\theta_2$ of the chlorine ion beams 27 and 29 and their elevation angles $\theta_2$.

The GaAs buffer layer 22, the Al$_{0.3}$Ga$_{0.7}$As barrier layer 23, the GaAs/Al$_{0.3}$Ga$_{0.7}$As multiquantum well layer 24, and the Al$_{0.3}$Ga$_{0.7}$As barrier layer 25 are consecutively grown by crystal growth on the GaAs substrate 21. Silicon dioxide films 26 are formed by deposition on the Al$_{0.3}$Ga$_{0.7}$As barrier layer 25 and shaped to have a stripe pattern as shown in FIG. 2A. The stripe pattern is formed to be arrange in the crystal orientation (110) along a line 104.

The Al$_{0.3}$Ga$_{0.7}$As barrier layer 25, the GaAs/Al$_{0.3}$Ga$_{0.7}$As multiquantum well layer 24, and the Al$_{0.3}$Ga$_{0.7}$As barrier layer 23 are consecutively etched by the reactive ion etching with chlorine, i.e., chlorine ion beam 27, using the silicon dioxide films 26 as etching masks. An incident direction of the chlorine ion beam 27 (29) is inclined about $\theta_2$=thirty degrees in the plane perpendicular to the line 104. In other words, the an elevation angle of 60° from the line 105 perpendicular to the line 104. The silicon dioxide films 26 sufficiently function as etching masks because there is a difference between the silicon dioxide films 26 (28) and the mass of the compound semiconductor crystals (Al$_{0.3}$Ga$_{0.7}$As barrier layer 25, the GaAs/Al$_{0.3}$Ga$_{0.7}$As multiquantum well layer 24, and Al$_{0.3}$Ga$_{0.7}$As barrier layer 23)in the etching speed. Moreover, an edge of each etching mask of the silicon dioxide films 26 (28) is slightly etched, so that the edge of the silicon dioxide films 26 back away slightly. Therefore, the surface of the mass of the compound semiconductor crystals just under the edge of each of silicon dioxide films 28 is also etched slightly. This makes one side wall surface formed further vertical as shown in FIG. 2B. The other side is formed slantwise in this stage of processing.

Then, the silicon dioxide film mask 26 is removed. Grooves 51 are filled with resist 52 as shown in FIG. 2C to make the surface of the semiconductor crystals 53 flat. Then, the etching mask 28 having a rectangular shape is formed to cover a portion of the resist 52 and surfaces of the remained Al$_{0.3}$Ga$_{0.7}$As barrier layer 25 such that necessary portions are left. A width of the etching mask 28 is made larger than that of the GaAs/Al$_{0.3}$Ga$_{0.7}$As multiquantum wire 30 to be formed. More specifically, one side of each silicon dioxide films 28 is overhanged and the other side covers the surfaces of the Al$_{0.3}$Ga$_{0.7}$As barrier layer 25.

Then, the resist 52 is removed. Then, the chlorine ion beam 29 is applied to the semiconductor crystals (21, 22, 23, 24, 25) and silicon dioxide films 28 with an incident direction inclined in the opposite to the inclined direction of the chlorine ion beam 27 as shown in FIG. 2D. The inclined angle is about thirty degrees with respect to the normal of the GaAs substrate 21. The vertical side wall surface of the semiconductor crystals 53 formed by the first etching is protected from the chlorine ion beam 19 by the overhanging portion 54. On the other hand, the other side of the semiconductor crystals 53 is etched, so that the other side wall surface is formed vertically because the chlorine ion beam is applied slantwise. The silicon dioxide films 28 sufficiently functions as etching masks because there is a difference between the silicon dioxide films 28 and the mass of the compound semiconductor crystals 53 in the etching speed. Moreover, an edge of each etching mask of the silicon dioxide films 28 is slightly etched, so that the edge of the silicon dioxide films 28 backs away slightly. Therefore, the surface of the mass of the compound semiconductor crystals just under the edge of each of the silicon dioxide films 28 is also etched slightly. This makes one side wall surface further vertical as shown in FIG. 2D.

Then, the silicon dioxide film masks 28 are removed and the GaAs/Al$_{0.3}$Ga$_{0.7}$As multiquantum wires 30 having vertical side wall surfaces are finally formed as shown in FIG. 2E.

The slantwise incident reactive ion beam used for etching provides accurate the etched side wall surfaces of the wire 30. Therefore, the processing of this embodiment provides fine structures, such as a quantum wire having a uniform width in the longitude direction by use of the multiquantum well with controllability. Moreover, this processing provides the multiquantum wires at a higher density within a unit area than the processing of the first embodiment.

In the second embodiment mentioned above, the compound semiconductors of the GaAs/Al$_{0.3}$Ga$_{0.7}$As system is used. However, this processing is applicable to other compound semiconductors, such as a compound semiconductor including InP or the like. Moreover, it is possible to form fine structures, such as a quantum box structure by forming the mask pattern to have a glide.

Hereinbelow will be described a third embodiment of this invention.

FIGS. 3A is a plan view of semiconductor materials to be processed through a processing method of this embodiment for illustrating processing of forming a GaAs quantum box structure. FIGS. 3B to 3E are cross-sectional views of semiconductor materials to be processed through a processing method of this embodiment for illustrating processing of forming a GaAs quantum box structure wherein FIG. 3B corresponds to the plan view of FIG. 3A. Numeral 31 is a GaAs substrate on which a quantum box structure is to be formed. Numeral 32 is a GaAs buffer layer. Numeral 33 is an $Al_{0.3}Ga_{0.7}As$ barrier layer. Numeral 34 is a GaAs/$Al_{0.3}Ga_{0.7}As$ multiquantum well layer. Numeral 35 is an $Al_3Ga_{0.7}As$ barrier layer. Numeral 36 is a silicon dioxide film mask having a cylindrical shape, formed on the $Al_{0.3}Ga_{0.7}As$ barrier layer 35. Numeral 37 is a slantwise incident chlorine ion beam. Numeral 38 is a GaAs/$Al_{0.3}Ga_{0.7}As$ multiquantum box structure to be formed. In this embodiment, the GaAs/$Al_{0.3}Ga_{0.7}As$ multiquantum well layer 34 is used. However, a single quantum well layer 34' can be used also.

Hereinbelow will be described the processing of the third embodiment.

The GaAs buffer layer 32, the $Al_{0.3}Ga_{0.7}As$ barrier layer 33, the GaAs/$Al_{0.3}Ga_{0.7}As$ multiquantum well layer 34, and the $Al_{0.3}Ga_{0.7}As$ barrier layer 35 are consecutively grown by crystal growth on the GaAs substrate 31. A silicon dioxide film 36 is formed by deposition on the $Al_{0.3}Ga_{0.7}As$ barrier layer 35 and shaped to have a circle as shown in FIG. 3A.

The $Al_{0.3}Ga_{0.7}As$ barrier layer 35, the GaAs/$Al_{0.3}Ga_{0.7}As$ multiquantum well layer 34, and the $Al_{0.3}Ga_{0.7}As$ barrier layer 33 are consecutively etched by the reactive ion etching with chlorine, i.e., chlorine ion beam 37, using the silicon dioxide film 36 as an etching mask. An incident direction of the chlorine ion beam 37 is inclined about $\theta_3$ = thirty degrees with respect to the normal of the GaAs substrate 31. During the etching, the GaAs substrate 31, the GaAs buffer layer 32, the $Al_{0.3}Ga_{0.7}As$ barrier layer 33, the GaAs/$Al_{0.3}Ga_{0.7}As$ multiquantum well layer 34, and the $Al_{0.3}Ga_{0.7}As$ barrier layer 35, and the silicon dioxide film 36 are rotated around the normal of the GaAs substrate 31.

The silicon dioxide film 36 sufficiently functions as an etching mask because there is a difference between the silicon dioxide film 36 and the mass of the compound semiconductor crystals ($Al_{0.3}Ga_{0.7}As$ barrier layer 35, the GaAs/$Al_{0.3}Ga_{0.7}As$ multiquantum well layer 34, and $Al_{0.3}Ga_{0.7}As$ barrier layer 33) in the etching speed. Moreover, an edge of the etching mask of the silicon dioxide film 36 is slightly etched, so that the edge of the silicon dioxide film 36 backs away slightly. Therefore, the surface of the mass of the compound semiconductor crystals just under the edge is also etched slightly. This makes the side wall surface further vertical as shown in FIGS. 3C to 3E. That is, a cylinder is formed.

The GaAs/$Al_{0.3}Ga_{0.7}As$ multiquantum box structure 38 is finally formed after the silicon dioxide film mask 36 is removed.

Using of the slantwise incident reactive ion beam for etching and rotation of the work under etching provides a more accurate and vertical etched side wall surface of the box structure through one etching processing.

In the third embodiment mentioned above, the compound semiconductors of the GaAs/$Al_{0.3}Ga_{0.7}As$ system is used. However, this processing is applicable to other compound semiconductors, such as a compound semiconductor including InP or the like. Moreover, in this embodiment, only one silicon dioxide film of the etching mask 36 is formed. However, it is possible to form a lot of box structures on the substrate 31 and the Ga As buffer layer by arranging a lot of etching masks 36 two-dimensionally.

Figure 7:
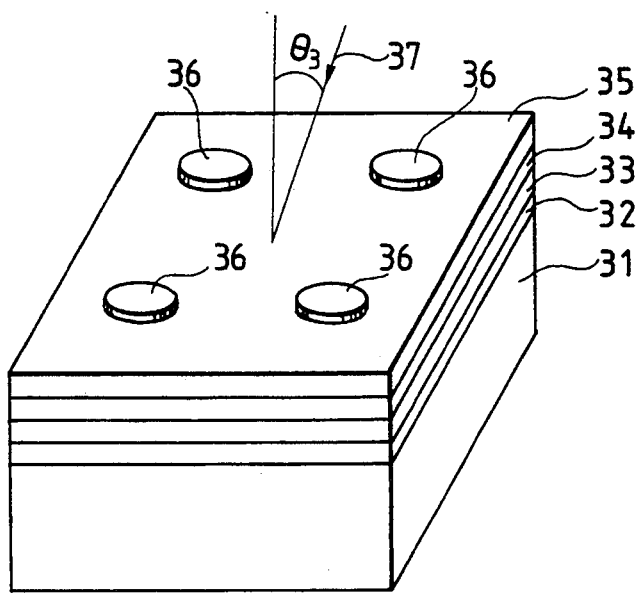
FIG. 7 is a perspective view showing a modified embodiment of the third embodiment.

FIG. 7 is a perspective view showing such a modified embodiment. In FIG. 7, silicon dioxide films 36 having substantial circle are arranged in an array. Other structure and processing is the same as the third embodiment.

What is claimed is:

1. A method of forming a wire on a compound semiconductor having a quantum well structure, which comprises the steps of:
   (a) forming a first etching mask for providing one side wall surface of said wire;
   (b) etching said compound semiconductor with a directional ion beam having a predetermined incident angle inclined to the side of said one side wall surface with respect to said wire;
   (c) forming a second etching mask for providing the other side wall surface of said wire; and
   (d) etching said compound semiconductor with said directional ion beam having said predetermined incident angle inclined to the side of the other side wall surface with respect to said wire.

2. A method of forming a wire on a compound semiconductor as claimed in claim 1, wherein said directional ion beam is a reactive ion beam.

3. A method of forming a wire on a compound semiconductor as claimed in claim 1, wherein said quantum well structure is a single quantum well structure.

4. A method of forming a wire on a compound semiconductor as claimed in claim 1, wherein said quantum well structure is a multiquantum well structure.

5. A method of forming a wire on a compound semiconductor as claimed in claim 1, wherein a width of said second etching mask is a larger width than that of said wire.

6. A method of forming a fine structure on a compound semiconductor having a quantum well structure, which comprises the steps of:
   (a) forming a substantially circular etching mask on a compound semiconductor substrate having a quantum structure;
   (b) etching said compound semiconductor with a directional ion beam having a predetermined incident angle; and
   (c) rotating said compound semiconductor during step (b) around a normal thereof, said predetermined incident angle being selected such that a side wall of said compound semiconductor as the result of the steps (b) and (c) being substantially parallel to said normal.

7. A method of forming a wire on a compound semiconductor as claimed in claim 6, wherein said quantum well structure is a single quantum well structure.

8. A method of forming a wire on a compound semiconductor as claimed in claim 6, wherein said quantum well structure is a multiquantum well structure.

9. A method of forming a wire on a compound semiconductor as claimed in claim 6, wherein a plurality of said substantially circular etching mask are arranged in an array on said compound semiconductor substrate.

10. A method of forming a wire on a compound semiconductor as claimed in claim 6, wherein said quantum well structure is a single quantum well structure.

11. A method of forming a wire on a compound semiconductor as claimed in claim 6, wherein said quantum well structure is a multiquantum well structure.

12. A method of forming a fine structure on a compound semiconductor, which comprises the steps of:
(a) covering a first portion of a surface of a compound semiconductor layer formed on a surface of a substrate with a first etching mask, wherein the compound semiconductor layer comprises a quantum well structure and an edge of said first etching mask defines a first line on the surface of the compound semiconductor;
(b) etching said compound semiconductor and said first etching mask by applying an ion beam to said first etching mask and said compound semiconductor from a first direction, at a predetermined elevation angle from a second line perpendicular to said first line and in the same plane as the surface of the compound semiconductor, to form a side wall surface between the first portion of the surface of the compound semiconductor covered by the first etching mask and a second portion of the compound semiconductor that is not covered by the first etching mask and is etched by the ion beam;
(c) removing said first etching mask;
(d) covering a stripe portion of said first portion of the surface of the compound semiconductor extending from said first line by a predetermined width and the side wall surface provided by step (b) with a second etching mask; and
(e) etching said compound semiconductor and said second etching mask by applying said ion beam in a second direction opposite from the side wall surface at said predetermined elevation angle from said second line.

13. A method of forming a wire on a compound semiconductor as claimed in claim 12, wherein said quantum well structure is a single quantum well structure.

14. A method of forming a wire on a compound semiconductor as claimed in claim 12, wherein said quantum well structure is a multiquantum well structure.

15. A method of forming a fine structure on a compound semiconductor, which comprises the steps of:
(a) forming a first etching mask comprising a plurality of first stripes, each first stripe having a first predetermined width and an edge that defines a first line on a surface of a compound semiconductor layer formed on a substrate, wherein the compound semiconductor layer includes a quantum well structure;
(b) etching said compound semiconductor and said first etching mask by applying an ion beam to said first etching mask and said compound semiconductor at a first direction having a predetermined elevation angle from second lines perpendicular to said first lines and in the same plane as the surface of the compound semiconductor;
(c) removing said first etching mask;
(d) filling etched portions of the compound semiconductor with resist;
(e) forming a second etching mask comprising a plurality of second stripes, each having a second predetermined width, larger than said first predetermined width, extending from said first line over a portion of the resist filling the etched portions of the compound semiconductor;
(f) removing said resist; and
(g) etching said compound semiconductor and said second etching mask by applying said ion beam in a second direction having said predetermined elevation angle from said second lines.

16. A method of forming a wire on a compound semiconductor as claimed in claim 15, wherein said quantum well structure is a single quantum well structure.

17. A method of forming a wire on a compound semiconductor as claimed in claim 15, wherein said quantum well structure is a multiquantum well structure.

* * * * *